United States Patent
Wang et al.

(10) Patent No.: US 7,334,244 B2
(45) Date of Patent: Feb. 19, 2008

(54) FLEXIBLE FLAT CABLE AND DISK DRIVE USING THE SAME

(75) Inventors: Ching-Yi Wang, Luzhou (TW);
Chi-Cheng Lin, Taoyuan (TW)

(73) Assignee: Benq Corporation, Taoyuan (TW)

( * ) Notice: Subject to any disclaimer, the term of this patent is extended or adjusted under 35 U.S.C. 154(b) by 343 days.

(21) Appl. No.: 10/968,195

(22) Filed: Oct. 19, 2004

(65) Prior Publication Data
US 2005/0099896 A1 May 12, 2005

(30) Foreign Application Priority Data
Nov. 6, 2003 (TW) .............................. 92131040 A

(51) Int. Cl.
*G11B 33/14* (2006.01)
*G11B 11/00* (2006.01)

(52) U.S. Cl. .................. 720/650; 360/245.9; 174/254; 361/818; 369/18

(58) Field of Classification Search ................ 720/650
See application file for complete search history.

(56) References Cited

U.S. PATENT DOCUMENTS

| | | | |
|---|---|---|---|
| 4,644,092 A | | 2/1987 | Gentry |
| 4,926,007 A | * | 5/1990 | Aufderheide et al. ......... 174/36 |
| 5,300,899 A | * | 4/1994 | Suski ............................. 333/1 |
| 5,556,300 A | * | 9/1996 | Parker ......................... 439/497 |
| 5,737,152 A | * | 4/1998 | Balakrishnan ........... 360/245.9 |
| 5,754,369 A | * | 5/1998 | Balakrishnan ........... 360/264.2 |
| 5,900,588 A | * | 5/1999 | Springer et al. ......... 174/117 F |
| 5,920,539 A | * | 7/1999 | Schell et al. ................ 720/658 |
| 6,487,048 B1 | * | 11/2002 | Dunn ....................... 360/245.9 |
| 6,560,097 B2 | * | 5/2003 | Naruo et al. ................ 361/685 |
| 6,839,202 B2 | * | 1/2005 | Zhou ....................... 360/234.5 |

FOREIGN PATENT DOCUMENTS

| | | |
|---|---|---|
| CN | 2566522 Y | 8/2003 |
| TW | 456764 | 9/2001 |
| TW | 535983 | 6/2003 |

OTHER PUBLICATIONS

Copy of Taiwan Office Action dated Jul. 10, 2007.

* cited by examiner

*Primary Examiner*—Angel Castro
*Assistant Examiner*—Christopher R. Magee
(74) *Attorney, Agent, or Firm*—Snell & Wilmer L.L.P.

(57) ABSTRACT

A flexible flat cable and a disk drive using the same are provided. The flexible flat cable is configured to suppress an electromagnetic interference (EMI) generated by a signal transmitted by it. The flexible flat cable includes a main body and a metal layer. The metal layer is disposed on the main body along the direction the signal is transmitted. The width of the metal layer along the direction, perpendicular to the direction the signal being transmitted, is smaller than the width of the main body.

7 Claims, 2 Drawing Sheets

FLEXIBLE FLAT CABLE AND DISK DRIVE USING THE SAME

CROSS-REFERENCE TO RELATED APPLICATION

This Application claims priority to Taiwan Patent Application No. 092131040 entitled "FLEXIBLE FLAT CABLE AND DISK DRIVE USING THE SAME," filed on Nov. 6, 2003.

FIELD OF INVENTION

The present invention relates to a flexible flat cable, which can suppress electromagnetic interference (EMI), and a disk drive using the same.

BACKGROUND OF THE INVENTION

The optical pickup is the key component of the disk drive to read and write data, and the quality requirement of data transmission of the optical pickup is higher than other consumer electronic apparatus. The optical pickup communicates with the main board by a flexible flat cable in the system. Due to high working frequency of the optical pickup, those signals would couple into the flexible flat cable to generate the harmonic noises, whose frequency range is usually from 700 MHz to 900 MHz. The noise emits radiation outward to other apparatus and causes electromagnetic interference (EMI).

There are solutions to suppress the electromagnetic interference (EMI), for example, coating a metal layer on the panel of the disk drive, or arranging a ferrite core on the flexible flat cable. The latter mentioned solution can suppress the electromagnetic interference (EMI) effectively but its shortcomings are higher cost and movement limitation of the flexible flat cable. As shown in FIG. 1, another solution to the mentioned problem is pasting the aluminum foil 108 on both sides of the flexible flat cable 102. The solution also can suppress the electromagnetic interference (EMI) effectively, but the aluminum foil 108 increases the possibility of signals coupling that usually influences the data-write quality of the optical pickup.

SUMMARY OF THE INVENTION

The present invention provides a flexible flat cable that can suppress the electromagnetic interference (EMI) while not influencing the data-write quality, and a disk drive using the same.

A flexible flat cable is provided to suppress electromagnetic interference (EMI) generated by a signal transmitted by it. The flexible flat cable includes a main body and a metal layer. The metal layer is disposed on the main body along the direction the signal being transmitted. The width of the metal layer along a direction, perpendicular to the direction that the signals are transmitted, is smaller than the width of the main body.

The metal layer can be arranged as a continuous stripe or a plurality of metal layer components separated from one another. In addition, the metal layer is disposed on the place that has higher electromagnetic interference (EMI), and the metal layer is made of cooper or aluminum.

A disk drive, including an optical pickup, a main board and the flexible flat cable, is also provided. The two ends of the flexible flat cable respectively connect with the optical pickup and the main board to transmit a signal between the optical pickup and the main board.

DETAILED DESCRIPTION

Figure 1:
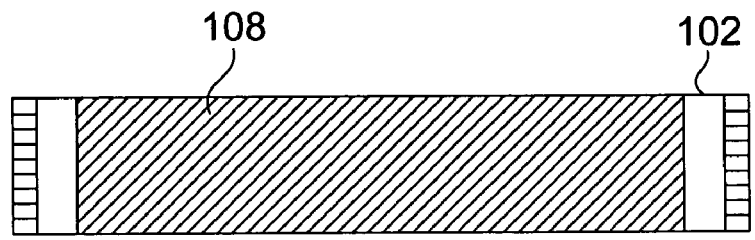
FIG. 1 shows a schematic diagram of a prior art flexible flat cable.
Figure 2:
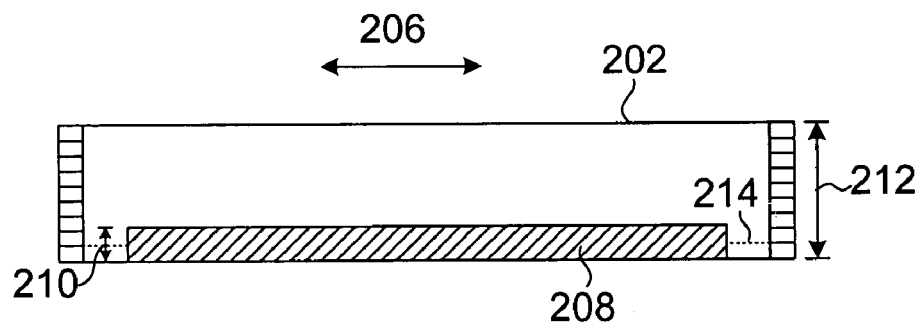
FIG. 2 shows a schematic diagram of the flexible flat cable of the first embodiment of the present invention.

As shown in FIG. 2, the flexible flat cable 200 includes a main body 202 and a metal layer 208. The metal layer 208 is disposed on the main body 202 along the direction 206 the signal is transmitted. The width 210 of the metal layer 208 along a direction, perpendicular to the direction 206, the signal being transmitted, is smaller than the width 212 of the main body 202.

The metal layer 208 may be only disposed on the place which has higher electromagnetic interferences (EMI), for example, on a transmission line 214 on which higher noises occur. The metal layer 208 is made of, for example, copper or aluminum, in form of copper foil or aluminum foil.

Figure 3:
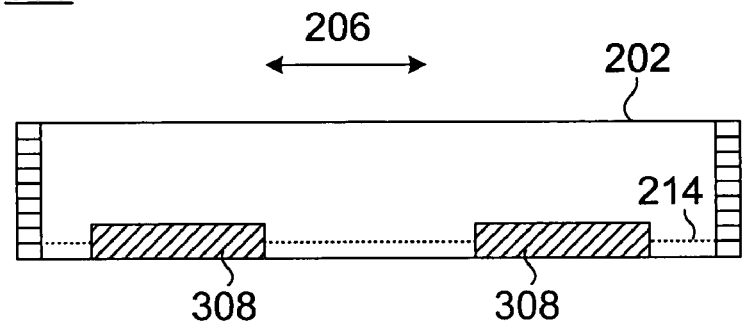
FIG. 3 shows a schematic diagram of the flexible flat cable of the second embodiment of the present invention.

In this embodiment of FIG. 3, the metal 308 is arranged as a plurality of metal layer components (non-continuous stripe) separated from one another, rather a continuous stripe in the first embodiment. The suppressing efficiencies of electromagnetic interference (EMI) are nearly the same for the first and the second embodiments. In high temperature working situation (about 35-45° C.), the data-write quality of the optical pickup of the disk drive can be kept in a reliable range.

Figure 4:
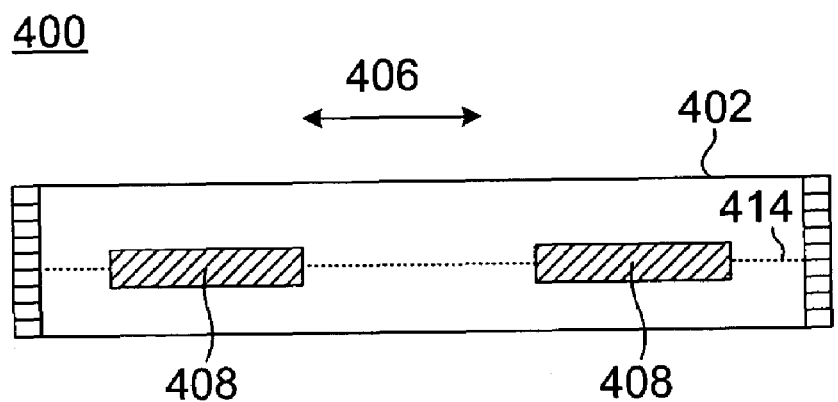
FIG. 4 shows a schematic diagram of the flexible flat cable of the third embodiment of the present invention.

FIG. 4 shows the third embodiment of the present invention. Like the flexible flat cable 300 of the second embodiment, the metal layer 408 is disposed only on the transmission line 414 on which higher noises occur. However, the location of the transmission line 414 is different from the transmission line 214.

Figure 5:
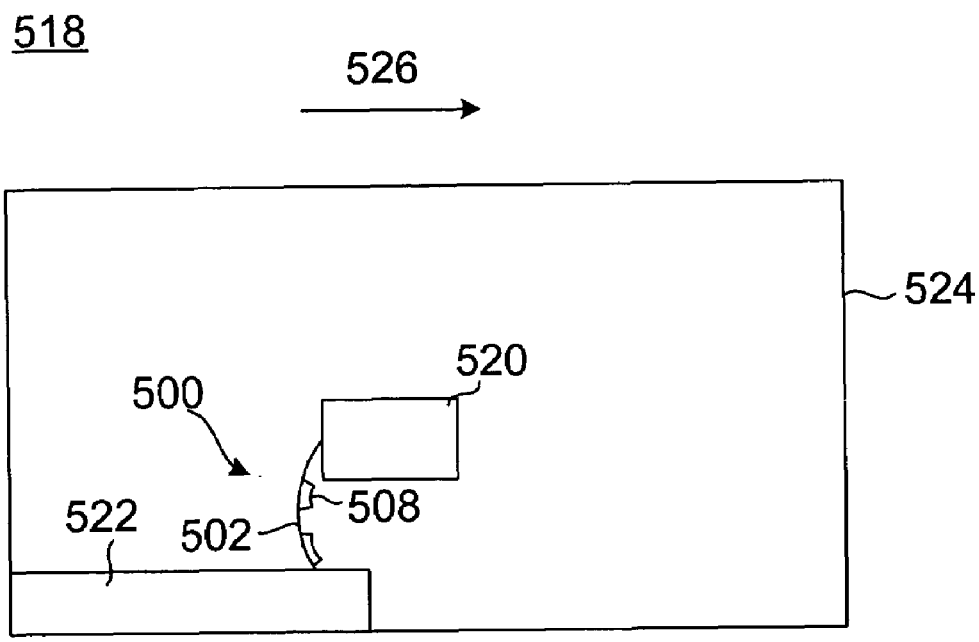
FIG. 5 shows a schematic diagram of the disk drive of the present invention.

As shown in FIG. 5, a disk drive 518 of the invention includes an optical pickup 520, a main board 522 and a flexible flat cable 500. The two ends of the flexible flat cable 500 respectively connect with the optical pickup 520 and the main board 522. The flexible flat cable 500 is used to transmit signals between the optical pickup 520 and the main board 522, and the flexible flat cable 500 can suppress an electromagnetic interference (EMI) like ones mentioned in FIGS. 2, 3, and 4. The flexible flat cable 500 includes a main body 502 and a metal layer 508. The metal layer 508 is disposed on the main body 502 along the direction the signal is transmitted. The width of the metal layer 508 along a direction, perpendicular to the direction the signal being transmitted, is smaller than the width of the main body 502. The metal layer 508 may be only disposed on locations that have higher electromagnetic interferences (EMI), for example, on a transmission line. The metal layer 508 is made of, for example, copper or aluminum, in form of copper foil or aluminum foil. In accordance with one exemplary aspect of this embodiment of the invention, the panel of the disk drive 518 is on the first side 524, and the metal layer 508 is disposed on the surface of cable 500 facing the first side 524.

Because the panel of the disk drive 518 is made of plastic in general cases, the noise generates the electromagnetic interference (EMI) emitting outward along the direction 526. Thus, the metal layer 508 is disposed on the main body 502 of the facing panel to suppress the electromagnetic interference (EMI).

While the invention has been described in connection with what is presently considered to be the most practical and preferred embodiments, it is to be understood that the invention is not to be limited to the disclosed embodiments. The invention is intended to cover various modifications and equivalent arrangements included within the spirit and scope of the appended claims.

We claim:

1. A flexible flat cable for suppressing an electromagnetic interference (EMI) generated by a signal transmitted by the flexible flat cable, the flexible flat cable comprising:
    a main body having a width and comprising at least one transmission line for carrying said signal; and
    a metal layer disposed on only one side of the transmission line of the main body along a transmission direction of the signal, said metal layer having a width, the direction of which is perpendicular to the transmission direction, the width of said metal layer being smaller than the width of the main body.

2. The flexible flat cable according to claim 1, wherein the metal layer includes a plurality of metal layer components, and each of the plurality of metal layer components are separated from one another in the transmission direction.

3. The flexible flat cable according to claim 1, wherein the metal layer comprises a material chosen from a group consisting of copper and aluminum.

4. A disk drive comprising:
    an optical pickup;
    a main board; and
    a flexible flat cable, two ends of the flexible flat cable connecting to the optical pickup and the main board respectively to transmit a signal between the optical pickup and the main board, the flexible flat cable comprising:
        a main body having a width and comprising at least one transmission line for carrying said signal; and
        a metal layer disposed on only one side of the transmission line of the main body along a transmission direction of the signal, said metal layer having a width, the direction of which is perpendicular to the transmission direction, the width of said metal layer being smaller than the width of the main body.

5. The disk drive according to claim 4, wherein the metal layer includes a plurality of metal layer components, and each of the plurality of metal layer components are separated from one another in the transmission direction.

6. The disk drive according to claim 4, wherein the metal layer comprises a material chosen from a group consisting of copper and aluminum.

7. A flexible flat cable for suppressing an electromagnetic interference (EMI) generated by a signal transmitted by the flexible flat cable, the flexible flat cable comprising:
    a main body having a width; and
    a plurality of metal layer components disposed on one side of the main body along a transmission direction of the signal, wherein each of the plurality of metal layer components are separated from one another in the transmission direction.

* * * * *